United States Patent
Proell et al.

(10) Patent No.: US 6,965,535 B2
(45) Date of Patent: Nov. 15, 2005

(54) INTEGRATED SEMICONDUCTOR MEMORY CIRCUIT AND A METHOD FOR OPERATING THE SAME

(75) Inventors: Manfred Proell, Dorfen (DE); Stephan Schroeder, Munich (DE); Ralf Schneider, Munich (DE); Joerg Kliewer, Munich (DE)

(73) Assignee: Infineon Technologies AG, Munich (DE)

( * ) Notice: Subject to any disclaimer, the term of this patent is extended or adjusted under 35 U.S.C. 154(b) by 53 days.

(21) Appl. No.: 10/742,761

(22) Filed: Dec. 23, 2003

(65) Prior Publication Data

US 2004/0184333 A1 Sep. 23, 2004

(30) Foreign Application Priority Data

Dec. 23, 2002  (DE) .......................................... 102 60 647

(51) Int. Cl.[7] ................................................ G11C 7/02
(52) U.S. Cl. .................... 365/208; 365/205; 365/185.13
(58) Field of Search ................................ 365/208, 205, 365/185.13

(56) References Cited

U.S. PATENT DOCUMENTS

| | | | | |
|---|---|---|---|---|
| 5,546,349 A | * | 8/1996 | Watanabe et al. | ....... 365/230.04 |
| 5,715,209 A | | 2/1998 | Yoo | |
| 5,822,268 A | * | 10/1998 | Kirihata | .................. 365/230.03 |
| 6,163,501 A | * | 12/2000 | Ohshima et al. | ............ 365/233 |

* cited by examiner

*Primary Examiner*—Anh Phung
*Assistant Examiner*—Tuan T. Nguyen
(74) *Attorney, Agent, or Firm*—Slater & Matsil, L.L.P.

(57) ABSTRACT

An integrated semiconductor memory includes a DRAM memory, in which primary sense amplifiers (SA) are coupled to a bit line (BL) of a respective cell block and can be connected to a common local data line (LDQ) by means of a respective assigned CSL switch in response to a CSL signal and in which an MDQ/LDQ switch arrangement connects a main data line (MDQ) to the local data line (LDQ) of a respective cell block in response to an MDQ/LDQ switch signal. In the case of the semiconductor memory, a control input of each CSL switch is connected to an AND element, which ANDs the CSL signal with the MDQ/LDQ switch signal and thereby activates the CSL switches only in cell blocks in which a word line has been activated.

16 Claims, 4 Drawing Sheets

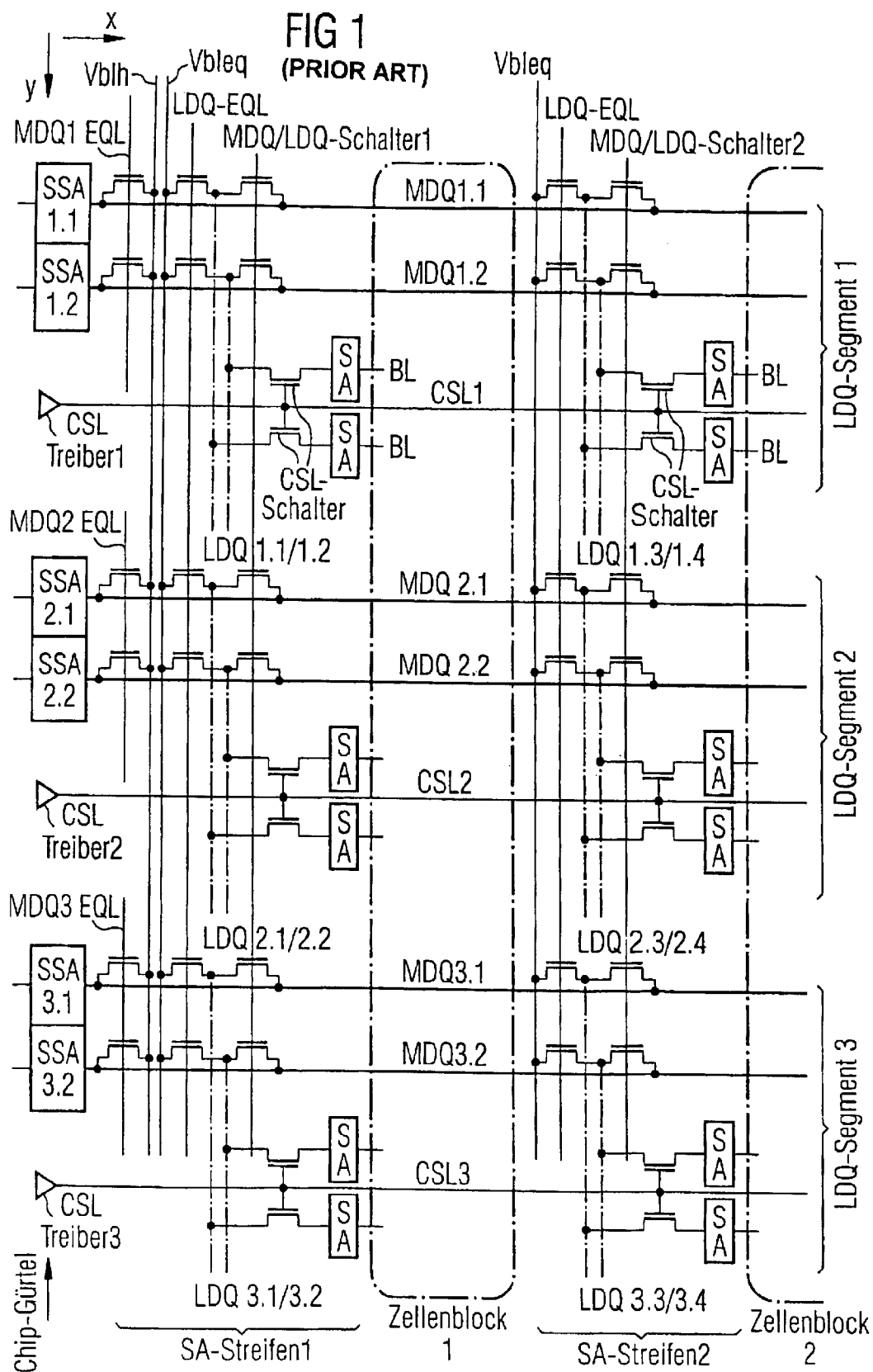

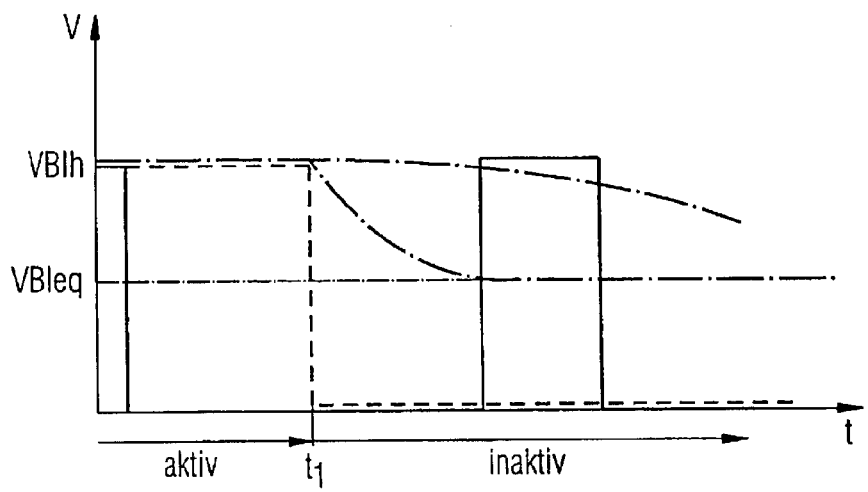
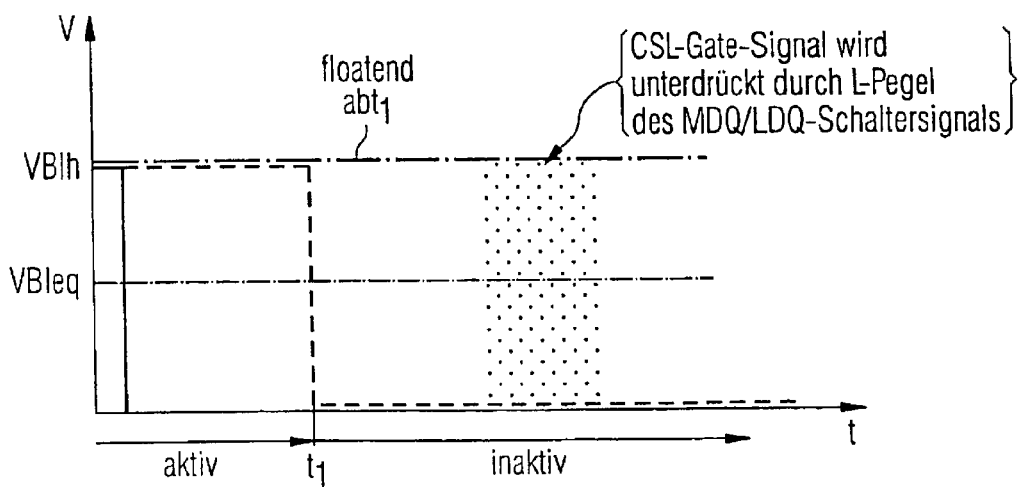

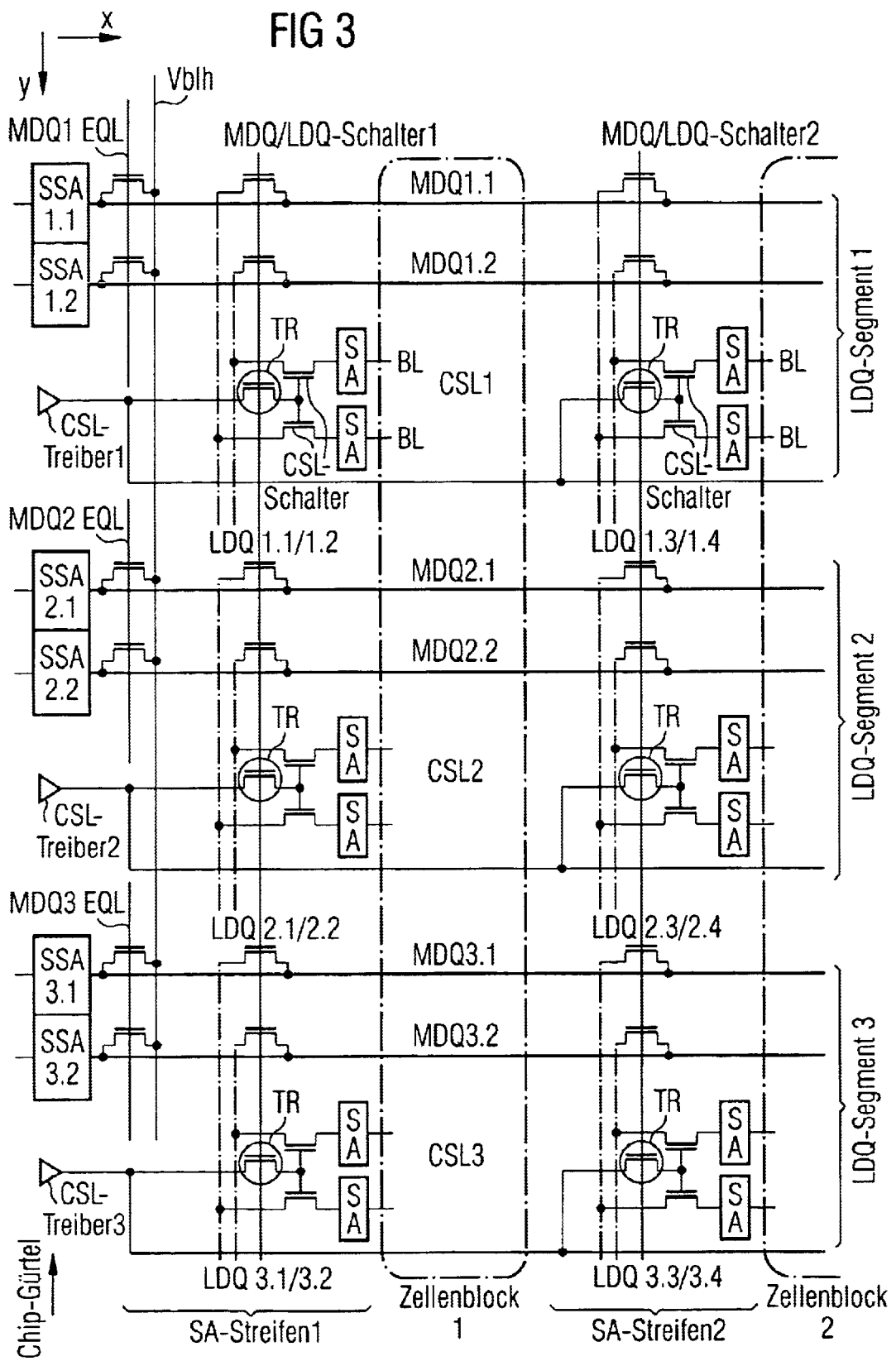

INTEGRATED SEMICONDUCTOR MEMORY CIRCUIT AND A METHOD FOR OPERATING THE SAME

BACKGROUND

1. Field of the Invention

The invention generally relates to integrated semiconductor circuits, such as DRAM memory circuits, and methods for operating such circuits.

2. Background Information

FIG. 1 illustrates a section of a conventional DRAM memory that has circuits for transporting data from sense amplifiers SA to data outputs of the DRAM memory chip. The memory cell array is subdivided into individual cell blocks in the row or X direction, of which a first cell block 1 and a second cell block 2 are shown. A so-called sense amplifier or SA strip lies between two adjacent cell blocks, in which strip are arranged the primary sense amplifiers SA connected to the bit lines BL and CSL switches respectively connected to the individual sense amplifiers SA. Furthermore, the local data lines (LDQs), for example LDQ1.1, 1.2, 2.1, 2.2, 3.1 and 3.2, are routed in the SA strip 1. Additionally situated in the SA strips are MDQ/LDQ switches, which serve for connecting the LDQs to the MDQs in response to a control signal, and also charge equalization transistors LDQ-EQL, which serve for precharging the LDQ lines to a center level Vbleq and are fed with a corresponding potential Vbleq.

As can be seen in FIG. 1, the LDQs are subdivided into individual segments, for example into the LDQ segments 1, 2 and 3, in the column direction Y, and the CSL lines CSL1, CSL2, CSL3 and also the MDQ switches and the charge equalization transistors are present for each segment. The CSL lines pass via all of the blocks of the cell array. The same applies to the MDQs, which can be connected to the LDQs via the MDQ/LDQ switches. What cannot be seen in the schematic diagram of FIG. 1 is that, in reality, all of the LDQs and MDQs are constructed as complementary line pairs.

The MDQs are connected to secondary sense amplifiers SSA, arranged in the chip belt. Both the primary sense amplifiers SA and the secondary sense amplifiers SSA are embodied as differential amplifiers and process the differential signals fed to them on the complementary BLs or LDQs, on the one hand, and the MDQs, on the other hand. The MDQ/LDQ switches represent a 1 out of X selection of the LDQ segments to the same associated MDQ. Which LDQ is switched through to the MDQ by the associated MDQ/LDQ switch depends upon the selected word line (not shown in FIG. 1), and thus on the corresponding spread BL or the spread SAs.

To simplify the illustration, the complementary lines have been omitted from FIG. 1, and only individual lines are depicted in each case for MDQ and LDQ line pairs. Added to these are the above mentioned precharge control lines for LDQ and MDQ for the driving of the LDQ charge equalization transistors and of MDQ charge equalization transistors situated in the chip belt. The LDQ and MDQ, in the precharge case, are respectively connected to corresponding generators for Vbleq and Vblh. While the LDQ precharge takes place for all of the LDQs that are not connected to the MDQs, for the MDQ precharge it is necessary in each case for the active SSA block to be excluded from the precharge. This presupposes an LDQ-segment-specific control of the MDQ-EQL transistors.

A CSL, which represents the applied Y address, selects in each case two primary sense amplifiers SA in all of the SA strips via the driven CSL switches, even though only few SAs have actually evaluated data. In other words, the CSL signal passing through a plurality of cell blocks also drives non-active SAs, or SAs of blocks in which no word line is activated.

FIG. 2a shows, on the basis of a signal timing diagram, precharge potentials of an LDQ of a cell block which, from an initially active state, assumes the inactive state starting from the instant t1. The instant t1 represents the instant at which the LDQ is decoupled from the MDQ, brought about by the MDQ/LDQ switch signal going low. Two possible and different profiles of the LDQ precharge level are illustrated by dash-dotted lines.

A potential problem arises if the LDQ was unable to be precharged to Vbleq at the instant of the CSL pulse signal. If the LDQs were still at high bit line level, a voltage greater than the center level would be established on the non-spread bit line connected to the LDQ by means of the CSL pulse signal, which would be able to be lowered again to the center level only slowly.

SUMMARY

The above-described problem associated with the LDQ precharge can be solved and a current-saving alternative for the LDQ precharge of an integrated semiconductor memory can be provided.

Accordingly, an integrated semiconductor memory is disclosed, including the following. A memory cell array is subdivided into individual cell blocks. The memory also includes primary sense amplifiers (SA), coupled to a bit line (BL) of a respective cell block and connected to a local data line (LDQ) common to the primary sense amplifiers by means of a respective CSL switch assigned to the primary sense amplifier in response to a CSL signal fed to said switch. A main data line (MDQ), which has, per cell block, an MDQ/LDQ switch arrangement for connecting the main data line (MDQ) to the local data line (LDQ) of a respective cell block in response to an MDQ/LDQ switch signal. A control input of each CSL switch is connected to an AND element, which ANDs the CSL signal applied to it with the MDQ/LDQ switch signal of this cell block and thereby activates the CLS switches for connecting the primary sense amplifiers (SA) assigned thereto to the common local data line (LDQ) only in cell blocks in which a word line has been activated.

A method also is disclosed for operating an integrated semiconductor memory, in which primary sense amplifiers (SA) connected to the bit lines (BL) of a memory cell array subdivided into individual cell blocks are connected to a local data line (LDQ) common to the primary sense amplifiers (SA) by means of a CSL signal fed to CSL switches respectively assigned to said primary sense amplifiers and the local data lines (LDQ) of each cell block are connected to a main data line (MDQ) common to all the cell blocks via a respective MDQ/LDQ switch arrangement by means of a switch signal fed to the latter. The CSL signal is ANDed with the MDQ/LDQ switch signal of the relevant cell block and the CSL switch thereby connects to the local data line (LDQ) only the primary sense amplifiers (SA), which are assigned to cell blocks in which a word line has been activated.

The invention is explained in more detail below with reference to the drawings and on the basis of preferred exemplary embodiments.

BRIEF DESCRIPTION OF THE DRAWINGS

The invention is explained in more detail below on the basis of examples and also with reference to the accompanying figures.

FIG. 1 illustrates, schematically and partly as a block diagram, conventional structure of a DRAM memory with segmented local data lines;

FIG. 2A is a signal timing diagram illustrating LDQ precharge levels in the active and inactive state of a cell block of the DRAM memory illustrated in FIG. 1;

FIG. 2B is a pulse timing diagram illustrating the temporal profile of the level on a local data line LDQ in the case of an integrated semiconductor memory in accordance with an embodiment of the invention;

FIG. 3 illustrates, schematically and partly as a block diagram, a section of a DRAM memory in accordance with an embodiment of the invention;

DETAILED DESCRIPTION

Figure 3A:
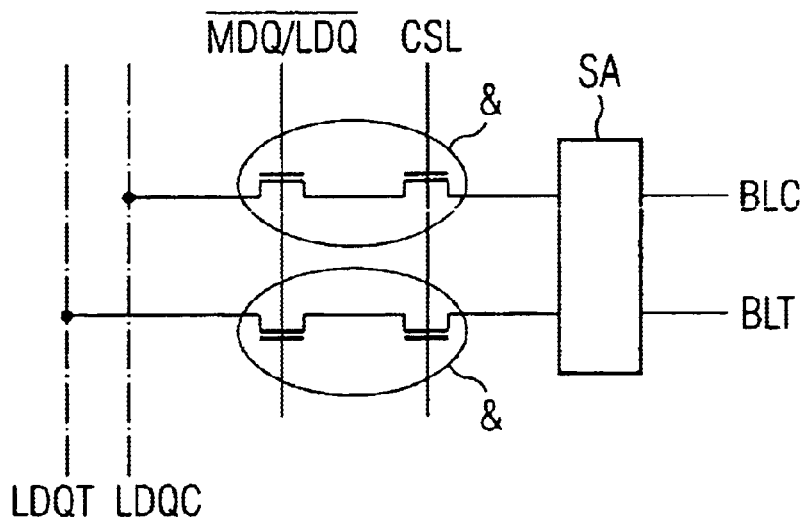
FIG. 3A illustrates a first exemplary embodiment of an ANDing of the MDQ/LDQ switch signal with the CSL pulse signal.

The following symbols are used consistently herein with reference to the figures:

| | |
|---|---|
| BL | Bit line |
| CSL | Column select line |
| LDQ | Local data line |
| MDQ | Main data line |
| SA | Primary sense amplifier |
| SSA | Secondary sense amplifier |
| TR | Transistor |
| Vblh | High bit line level |
| Vbleq | Center bit line level |
| & | ANDing |
| BLC, BLT | complementary bit lines |
| LDQT, LDQC | complementary local data lines |

The invention relates to an integrated semiconductor memory, in particular a DRAM memory, having a memory cell array subdivided into individual cell blocks, primary sense amplifiers, which are coupled to a bit line of a respective cell block and connected to a local data line—common to the primary sense amplifiers—by means of a respective CSL switch assigned to the primary sense amplifier—in response to a CSL signal fed to said switch, and a main data line, which has, per cell block, an MDQ/LDQ switch arrangement for connecting the main data line to the local data line of a respective cell block in reaction to an MDQ/LDQ switch signal, and to a method for operating an integrated semiconductor memory of this type.

After a precharge command has been sent, that is to say while the local data lines (LDQs) are decoupled from the main data lines (MDQs), memory modules have to charge the MDQs to the full high bit line level (Vblh) and the LDQs to half the bit line level (center voltage=Vbleq). The local data lines therefore have to be precharged to the center level in order that the non-spread bit lines along an entire column select line (CSL) furthermore remain at their center level when the pulsed CSL signal switches the bit line (BL) to the LDQ. If the LDQs were put at the high bit line level, then a voltage greater than the center level would be established on the non-spread bit line connected to the LDQs by means of the CSL pulse signal, which would be able to be lowered to the center level again only slowly via the weak leakage current compensation transistors of the bit line. As a result, the primary sense amplifier (SA) would not be at its predetermined operating point, that is to say it becomes slow and the transfer ratio for a physical "1" in the memory cell would likewise be reduced in the event of a subsequent access to the same bit line. After the precharge command, upon the next activation command of the memory module along a logical word line, which are physical word lines activated by an X address, all the LDQs are connected to the MDQs, and the capacitance of the LDQs has to be subjected to charge reversal from the center level to the high bit line level. This makes up a good part of the operating current.

Modifications in comparison with FIG. 1 for an LDQ that is precharged by the MDQ precharge to Vblh in the precharge phase are described with reference to the circuit diagram shown in FIG. 3. FIG. 3 lacks the LDQ charge equalization transistors LDQ-EQL in comparison with FIG. 1. They are now superfluous. In order to avoid the disadvantages of the LDQ precharge operation that are discussed in the introduction for the non-spread bit lines, it must be ensured that only the transfer gates of the CSL switches (switching SA or BL to LDQ) in the case of which the primary sense amplifier SA has spread the bit line BL are activated by the CSL pulse signal. The information for this control is present in the individual SA strips by means of the MDQ/LDQ switch signal, and merely has to be ANDed with the CSL signal of the corresponding LDQ segment.

FIG. 3A shows a circuit diagram of an embodiment in which the abovementioned ANDing is realized by a series circuit of two transfer gates between SA and BL (complementary bit lines BLT, BLC), and the corresponding one of the two complementary LDQs, that is to say LDQT and LDQC, which accordingly requires two additional FET transistors. The gates of the first FET transistors of the two AND circuits are controlled by the CSL pulse signal CSL and the gates of the second FET transistors of the two AND circuits are controlled by the MDQ/LDQ switch signal.

Figure 3B:
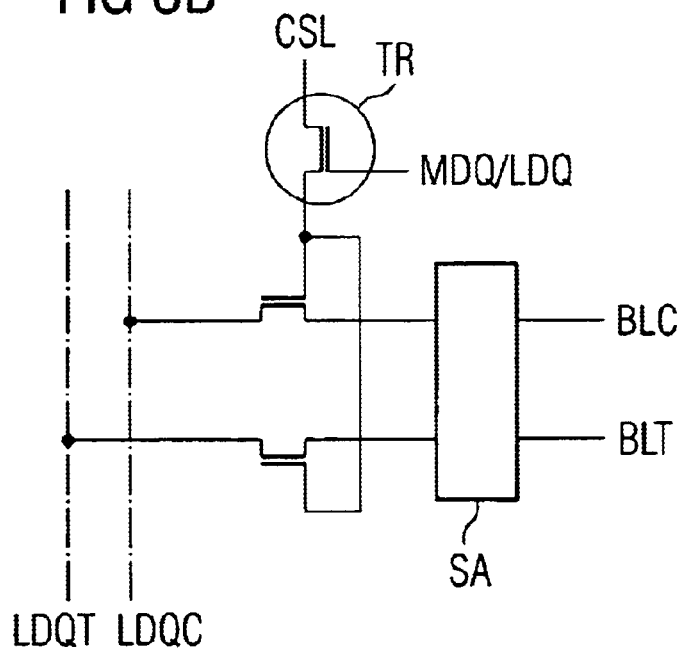
FIG. 3B illustrates a second exemplary embodiment of an ANDing of the MDQ/LDQ switch signal with the CSL pulse signal, in the case of which only a single FET transistor is required.

In cell blocks in which no word line has been activated and thus the intention is neither for the bit line to be spread nor for the LDQ to be coupled to the MDQ, the MDQ/LDQ switch signal remains inactive, and the two AND circuits shown in FIG. 3A prevent equalization of the charges of BL (Vbleq) and LDQ (Vblh). Since the CSL pulse signal on the CSL line is only ever a short signal which always occurs within the duration of the MDQ/LDQ switch signal pulse, the ANDing shown in FIG. 3A can be realized, in accordance with FIG. 3B, with only one transistor TR, which controls four transfer gates for each CSL switch. It must be noted at this point, however, that FIG. 3 only shows two transfer gates per CSL switch since, as already in FIG. 1 the complementary BLs, LDQs and MDQs and thus also the corresponding transfer gates for the complementary LDQs and BLs are omitted. By contrast, FIG. 3B shows the genuine arrangement with the complementary bit lines BLT and BLC, the differential SA and the complementary LDQT and LDQC.

The accompanying FIG. 2B shows the improvement achieved by the inventive configuration of the integrated semiconductor memory in comparison with the conditions shown in FIG. 2A. By virtue of the low level of the MDQ/LDQ switch signal from the instant t1 the CSL pulse signal is suppressed for all the primary sense amplifiers SA of inactive cell blocks. The short CSL pulse signal can definitely be suppressed in the inactive state of the cell block since the CSL pulse signal always lies within the MDQ/LDQ switch signal.

Although the structure of an integrated semiconductor memory proposed according to an embodiment of the invention in accordance with FIG. 3 requires an additional transistor TR per four transfer gates of the CSL switch, this nevertheless has the advantages that the proportion of operating current for the charge reversal of the LDQs from Vblh to Vbleq can be saved and that the equalization transistors for the LDQs become superfluous. Furthermore, this reduces the total capacitance of the CSL lines since significantly fewer capacitive transistor gates are directly connected to the CSL line. As a result, the short CSL pulse signal can become faster and acquire steeper edges, which means a gain in performance.

By virtue of the fact that an integrated semiconductor memory of the generic type, in particular a DRAM memory, in accordance with a first aspect of the invention, has an AND element connected to a control input of each CSL switch, which AND element combines the CSL signal applied to it with the MDQ/LDQ switch signal of this cell block and thereby activates the CSL switches for connecting the primary sense amplifier assigned thereto to the local data line only in cell blocks in which a word line has been activated, the CSL signal, at the primary sense amplifiers connected to the CSL switch, can have an effect only in active cell blocks and is suppressed in all the non-active cell blocks, that is to say in those cell blocks in which no word line has been activated, by means of the low level of the MDQ/LDQ switch signal that prevails therefor. This means that from the moment when LDQ is decoupled from MDQ by the MDQ/LDQ switch, the LDQs of all the non-active cell blocks are in the floating state.

The described embodiments of the invention thus saves the proportion of operating current required for the charge reversal of the LDQs from the full high bit line level Vblh to the center level Vbleq. Furthermore, the charge equalization transistors for the LDQs become superfluous. By way of example, in the case of a 256 M S14 memory module having eight LDQ segments along a word line, sixteen 4M blocks per bank, four LDQ pairs per 4M block, 2 LDQs per LDQ pair and four banks, it is possible to save 4096 transistors per memory chip.

The proposed integrated semiconductor memory additionally reduces the total capacitance of the CSL line since significantly fewer of the capacitive transistor gates are directly connected to the CSL line. As a result, the short CSL pulse signal can become faster, in other words it has a shorter propagation time to the chip edge, and acquires steeper edges. This increases the entire performance of the memory module.

In accordance with a second aspect of the invention, a method is provided for operating an integrated semiconductor memory, in particular a DRAM memory in which primary sense amplifiers connected to the bit lines of a memory cell array subdivided into individual cell blocks are connected to a local data line—common to the primary sense amplifiers—by means of a CSL signal fed to CSL switches respectively assigned to said primary sense amplifiers and the local data lines of each cell block are connected to a main data line—common to all the cell blocks—via a respective MDQ/LDQ switch arrangement by means of a switch signal fed to the latter. The method is characterized by the fact that the CSL signal is ANDed with the MDQ/LDQ switch signal of the relevant cell block and the CSL switch thereby connects to the local data line only the primary sense amplifiers which are assigned to cell blocks in which a word line has been activated.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. An integrated semiconductor memory comprising:
   a memory cell array subdivided into individual cell blocks;
   primary sense amplifiers (SA), coupled to a bit line (BL) of a respective cell block and connected to a local data line (LDQ) common to the primary sense amplifiers by means of a respective CSL switch assigned to the primary sense amplifier in response to a CSL signal fed to said switch; and
   a main data line (MDQ), which has, per cell block, an MDQ/LDQ switch arrangement for connecting the main data line (MDQ) to the local data line (LDQ) of a respective cell block in response to an MDQ/LDQ switch signal,
   wherein a control input of each CSL switch is connected to an AND element, which ANDs the CSL signal applied to it with the MDQ/LDQ switch signal of this cell block and thereby activates the CLS switches for connecting the primary sense amplifiers (SA) assigned thereto to the common local data line (LDQ) only in cell blocks in which a word line has been activated.

2. The semiconductor memory of claim 1, wherein the local data lines (LDQ) are subdivided into segments in the column direction (y) of the memory cell array, and in that a separate CSL signal is fed to the CSL switches of each segment via a corresponding CSL signal line which is common to all the cell blocks.

3. The semiconductor memory of claim 2, wherein in each case two local data lines (LDQ) are provided per segment, which lines are connected to two corresponding main data lines (MDQ) by two MDQ/LDQ switches of the MDQ/LDQ switch arrangement, which switches are actuated simultaneously by the MDQ/LDQ switch signal.

4. The semiconductor memory of claim 3, wherein
   each main data line (MDQ) of each segment is routed to an individual secondary sense amplifier (SSA).

5. The semiconductor memory of claim 4, wherein the bit lines (BL), the local data lines (LDQ) and the main data lines (MDQ) are embodied in each case in the form of two mutually complementary lines (BLT, BLC, LDQT, LDQC and MDQT, MDQC) and the primary sense amplifiers (SA) and the secondary sense amplifiers (SSA) are embodied in each case as differential amplifiers.

6. The semiconductor memory of claim 5, wherein the CSL switch comprises a transfer gate for each of the complementary local data lines (LDQ).

7. The semiconductor memory of claim 1, wherein the AND element connected to each CSL switch is an individual FET transistor.

8. The semiconductor memory of claim 1, wherein each main data line (MDQ) common to all the cell blocks of a segment is connected to a charge equalization circuit (MDQ/EQL) in order to precharge the relevant main data line (MDQ) and a local data line (LDQ) connected to the latter at this time to a predetermined precharge potential (Vblh) in response to a precharge command.

9. The semiconductor memory of claim 1, wherein the primary sense amplifiers (SA), the local data lines (LDQ), the MDQ/LDQ switch arrangement, the CSL switches and the AND elements respectively connected thereto of a respective cell block are arranged in a sense amplifier strip (SA strip) lying between the latter and an adjacent cell block.

10. The semiconductor memory of claim 1, wherein the secondary sense amplifiers (SSA) and the charge equalization circuits (MDQ/EQL) of all the segments are arranged in a chip belt lying outside the cell blocks.

11. The semiconductor memory of claim 1, wherein the semiconductor memory it is a DRAM memory.

12. A method for operating an integrated semiconductor memory, in which primary sense amplifiers (SA) connected to the bit lines (BL) of a memory cell array subdivided into individual cell blocks are connected to a local data line (LDQ) common to the primary sense amplifiers (SA) by means of a CSL signal fed to CSL switches respectively assigned to said primary sense amplifiers and the local data lines (LDQ) of each cell block are connected to a main data line (MDQ) common to all the cell blocks via a respective MDQ/LDQ switch arrangement by means of a switch signal fed to the latter, wherein the CSL signal is ANDed with the MDQ/LDQ switch signal of the relevant cell block and the CSL switch thereby connects to the local data line (LDQ) only the primary sense amplifiers (SA), which are assigned to cell blocks in which a word line has been activated.

13. The method of claim 12, in which the local data lines (LDQ) are subdivided into segments in the column direction (Y) of the memory cell array, wherein a separate CSL signal common to all the cell blocks is fed to the CSL switches of a respective segment.

14. The method of claim 12, wherein a main data line (MDQ) and a local data line (LDQ) connected to the latter at a time are precharged to a predetermined precharge potential (Vblh) in response to a precharge command.

15. The method as claimed in claim 14, wherein the precharge potential (Vblh) is the full high bit line potential.

16. The method as claimed in claim 12, wherein the integrated semiconductor memory is a DRAM memory.

* * * * *